US010005155B2

(12) United States Patent
Moon et al.

(10) Patent No.: US 10,005,155 B2
(45) Date of Patent: Jun. 26, 2018

(54) LASER CUTTING DEVICE

(71) Applicant: SAMSUNG DISPLAY CO., LTD., Yongin-si, Gyeonggi-Do (KR)

(72) Inventors: Byeongnam Moon, Yongin-si (KR); Jaepil Lee, Yongin-si (KR); Myeonglyeol Yu, Yongin-si (KR); Wonyoung Lee, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 39 days.

(21) Appl. No.: 14/883,652

(22) Filed: Oct. 15, 2015

(65) Prior Publication Data
US 2016/0129527 A1 May 12, 2016

(30) Foreign Application Priority Data

Nov. 11, 2014 (KR) .................. 10-2014-0156234

(51) Int. Cl.
*B23K 26/16* (2006.01)
*B23K 26/38* (2014.01)
(Continued)

(52) U.S. Cl.
CPC ............ *B23K 26/16* (2013.01); *B23K 26/142* (2015.10); *B23K 26/1476* (2013.01);
(Continued)

(58) Field of Classification Search
CPC .. B23K 203/172; B23K 201/40; B23K 26/00; B23K 26/16; B23K 26/142;
(Continued)

(56) References Cited

U.S. PATENT DOCUMENTS 4,027,137 A * 5/1977 Liedtke ................ B23K 26/123
219/121.6
6,833,222 B1 * 12/2004 Buzerak .................... G03F 1/64
156/267
(Continued)

FOREIGN PATENT DOCUMENTS

JP 2007-000972 A 1/2007
JP 2012148300 A * 8/2012
(Continued)

OTHER PUBLICATIONS

R. A. Lujan, Flexible X-Ray Detector Array Fabricated With Oxide Thin-Film Transistors, Apr. 3, 2012, IEEE Electronic Device Letters, vol. 33, No. 5, pp. 688-690.*

(Continued)

*Primary Examiner* — Alison L Hindenlang
*Assistant Examiner* — Sedef E Paquette
(74) *Attorney, Agent, or Firm* — Lee & Morse, P.C.

(57) ABSTRACT

A laser cutting device, including a laser beam generation unit emitting a laser beam; an optical system on a traveling path of the laser beam; a laser main body providing a passage through which the laser beam travels towards a substrate after passing through the optical system; a suction unit coupled to a header of the laser main body and sucking impurities, the suction unit including a curved surface therein; and a collection unit connected to the suction unit and collecting discharged impurities, the impurities being discharged to the collection unit along the curved surface inside the suction unit.

15 Claims, 6 Drawing Sheets

(51) Int. Cl.
*B23K 26/14* (2014.01)
*B23K 26/142* (2014.01)
*B23K 103/16* (2006.01)
*B23K 101/40* (2006.01)
*B23K 103/00* (2006.01)

(52) U.S. Cl.
CPC .......... *B23K 26/38* (2013.01); *B23K 2201/40* (2013.01); *B23K 2203/172* (2015.10); *B23K 2203/50* (2015.10); *H01L 2251/566* (2013.01)

(58) Field of Classification Search
CPC .. B23K 26/1476; B23K 26/38; B23K 26/402; B23K 26/14; H01L 2251/566; B29C 67/0066; B29C 64/00; B29C 64/153; B29C 64/268; B33Y 10/00; B33Y 30/00
USPC ........................................ 264/409; 425/174.4
See application file for complete search history.

(56) References Cited

U.S. PATENT DOCUMENTS

2002/0020154 A1\* 2/2002 Yang ....................... A47L 9/165
55/337
2008/0229539 A1\* 9/2008 Hwang .................... A47L 5/30
15/346

FOREIGN PATENT DOCUMENTS

| KR | 10-2006-0037580 A | | 5/2006 |
|---|---|---|---|
| KR | 20060037580 A | \* | 5/2006 |
| KR | 10-2008-0001271 A | | 1/2008 |
| KR | 20080001271 A | \* | 1/2008 |
| KR | 10-2011-0062886 A | | 6/2011 |
| KR | 20110062886 A | \* | 6/2011 |
| KR | 10-2012-0072003 A | | 7/2012 |

OTHER PUBLICATIONS

Hsiao-Hsuan Hsu, Room-temperature flexible thin film transistor with high mobility, May 6, 2013, Current Applied Physics 13, pp. 1459-1462.\*
Lee (KR 2006-0037580, machine translation).\*
Choi (KR 2011-0062886, machine translation).\*
Park (KR 2008-0001271, machine translation).\*
The American Heritage Dictionary, definition for "compressor".\*
Uno et al. (JP 2012-148300, machine translation, Aug. 9, 2012).\*

\* cited by examiner

LASER CUTTING DEVICE

CROSS-REFERENCE TO RELATED APPLICATION

Korean Patent Application No. 10-2014-0156234, filed on Nov. 11, 2014, in the Korean Intellectual Property Office, and entitled: "Laser Cutting Device," is incorporated by reference herein in its entirety.

BACKGROUND

1. Field

One or more exemplary embodiments relate to a laser cutting device.

2. Description of the Related Art

A display device may include, for example, an organic light-emitting display apparatus, a liquid crystal display (LCD), an electrophoretic display (ED), a surface-conduction electron-emitter display (SED), or a vacuum fluorescent display (VFD).

SUMMARY

Embodiments may be realized by providing a laser cutting device, including a laser beam generation unit emitting a laser beam; an optical system on a traveling path of the laser beam; a laser main body providing a passage through which the laser beam travels towards a substrate after passing through the optical system; a suction unit coupled to a header of the laser main body and sucking impurities, the suction unit including a curved surface therein; and a collection unit connected to the suction unit and collecting discharged impurities, the impurities being discharged to the collection unit along the curved surface inside the suction unit.

The suction unit may include a suction main body; a nozzle inside the suction main body and providing a passageway for the laser beam and gas; an exhaust part in the suction main body and through which the impurities are sucked; and a connection pipe connected to the exhaust part and the collection unit.

The suction main body may have a hollow region therein, and the nozzle may be spaced apart from an inner-circumferential wall of the suction main body.

The nozzle may have a through hole through which the laser beam traveling towards the substrate is irradiated.

The nozzle may have a circular cross-sectional shape in a direction orthogonal to a direction in which the laser beam is irradiated.

The exhaust part may include a space between the inner-circumferential wall of the suction main body and an outer-circumferential surface of the nozzle.

The curved surface may be in the inner-circumferential wall of the suction main body and may curve in a direction in which the laser beam is irradiated.

The exhaust part may be a ring shape surrounding the nozzle.

The space of the exhaust part between the inner-circumferential wall of the suction main body and the outer-circumferential surface of the nozzle may be connected to the connection pipe via a penetrated portion in at least one side of the suction main body.

The connection pipe may connect the collection unit and the space of the exhaust part between the inner-circumferential wall of the suction main body and the outer-circumferential surface of the nozzle.

The space of the exhaust part between the inner-circumferential wall of the suction main body and the outer-circumferential surface of the nozzle may be connected to one end of the connection pipe by a path penetrating a thickness of the suction main body in a direction orthogonal to a direction in which the laser beam is irradiated, and the other end of the connection pipe may be connected to the collection unit.

The nozzle may be connected through a gas supply pipe to a pump generating gas.

The gas supply pipe may be coupled to an upper end of the nozzle.

The collection unit may include a collection case connected to the suction unit; an exhaust pipe inside the collection case; and a filter connected to the exhaust pipe.

The exhaust pipe may rotate in one direction and may suck the impurities from the suction unit.

Gas collected with the impurities in the collection case may be discharged outside of the collection case through the exhaust pipe.

The filter may be mounted below the exhaust pipe and may collect impurity particles in a lower portion of the collection case.

The substrate may be large enough to form a plurality of display devices.

The substrate may include a flexible substrate, and the flexible substrate may include a thin-film transistor and an organic light-emitting diode connected to the thin-film transistor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
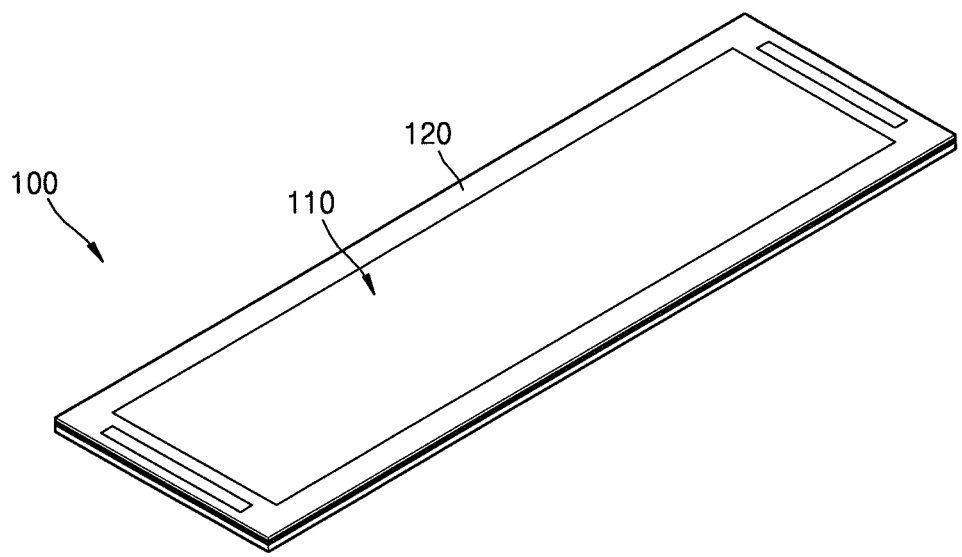
FIG. 1 illustrates a perspective view of a flexible display device in an unrolled form, according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another.

The terminology used in the application is used only to describe specific embodiments and is not intended to be limiting. An expression in the singular includes an expression in the plural unless they are clearly different from each other in context. In the application, it should be understood that terms, such as "include" and "have", are used to indicate the existence of an implemented feature, number, step, operation, element, part, or a combination thereof without excluding in advance the possibility of the existence or addition of one or more other features, numbers, steps, operations, elements, parts, or combinations thereof.

As used herein, expressions such as "at least one of," when preceding a list of elements, modify the entire list of elements and do not modify the individual elements of the list.

Hereinafter, embodiments of a laser cutting device will now be described in detail with reference to the accompanying drawings.

Figure 2:
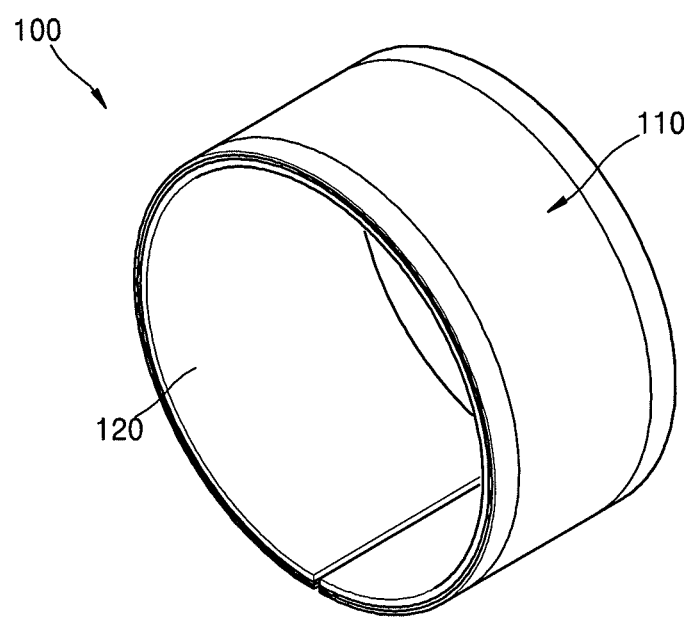
FIG. 2 illustrates a perspective view of the flexible display device of FIG. 1 in a rolled form.

FIG. 1 illustrates a perspective view of a flexible display device 100 in an unrolled form, according to an embodiment, and FIG. 2 illustrates a perspective view of the flexible display device 100 of FIG. 1 of a rolled shape. Referring to FIGS. 1 and 2, the flexible display device 100 may include a flexible display panel 110 for displaying an image and a flexible case 120 for accommodating the flexible display panel 110. The flexible display panel 110 may include not only elements for implementing a screen but also various films such as, for example, a touch screen, a polarizing plate, and a window cover. The flexible display device 100 may allow a user to view an image at various angles, such as, for example, in an unrolled state or a rolled state.

Although it is described in the present embodiment that the flexible display device 100 is an organic light-emitting display as an example, the flexible display device 100 may be one of various flexible display devices, such as, for example, a liquid crystal display (LCD), a field emission display, and an electronic paper display. According to an embodiment, the flexible display device 100 may have rigidity.

Figure 3:
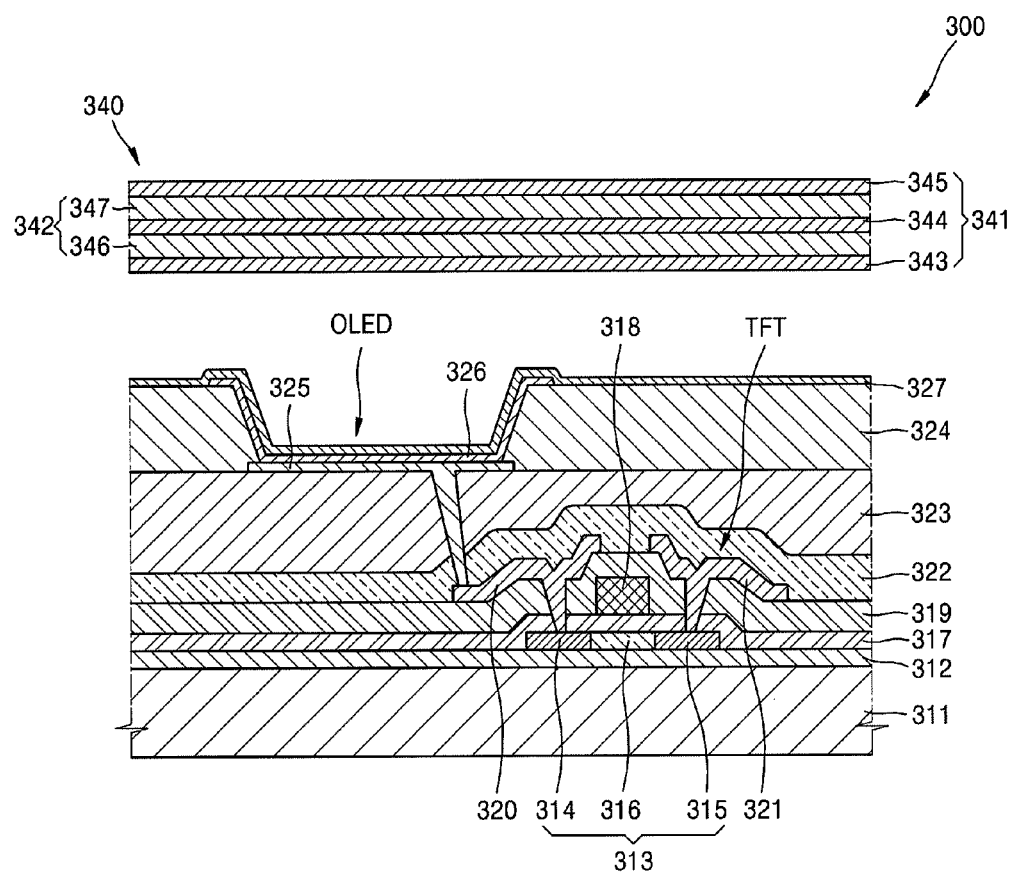
FIG. 3 illustrates a cross-sectional view of one sub-pixel of a flexible display device according to an embodiment.

FIG. 3 illustrates a cross-sectional view of one sub-pixel of a flexible display device 300 according to an embodiment.

The sub-pixel may include at least one thin-film transistor (TFT) and an organic light-emitting device OLED. FIG. 3 illustrates an exemplary TFT structure. In embodiments, the number of TFTs and structures of the TFTs may be modified in various ways.

Referring to FIG. 3, the flexible display device 300 may include a flexible substrate 311 and a thin-film encapsulation layer 340 facing the flexible substrate 311.

The flexible substrate 311 may be formed of a flexible insulating material.

The flexible substrate 311 may include a polymer material, such as, for example, polyimide (PI), polycarbonate (PC), polyethersulphone (PES), polyethylene terephthalate (PET), polyethylene naphthalate (PEN), polyarylate (PAR), or fiber glass reinforced plastic (FRP). According to an embodiment, the flexible substrate 311 may be a flexible thin glass substrate.

The flexible substrate 311 may be transparent, translucent, or opaque.

A barrier layer 312 may be formed on the flexible substrate 311. The barrier layer 312 may completely cover an upper surface of the flexible substrate 311.

The barrier layer 312 may be formed of an inorganic material, such as, for example, silicon oxide ($SiO_x$), silicon nitride ($SiN_x$), silicon oxynitride ($SiO_xN_y$), aluminum oxide (AlOx), or aluminum nitride ($AlN_x$), or an organic material, such as, for example, acryl, PI, or polyester.

The barrier layer 312 may be formed as a single-layer film or a multi-layer film.

The barrier layer 312 may block oxygen and moisture and may planarize the upper surface of the flexible substrate 311.

A TFT may be formed on the barrier layer 312. Although it is described in the present embodiment that the TFT is a top gate transistor, the TFT may have another structure, such as a bottom gate transistor.

A semiconductor active layer 313 may be formed on the barrier layer 312.

The semiconductor active layer 313 may include a source region 314 and a drain region 315 by doping parts of the semiconductor active layer 313 with N-type or P-type impurity ions. A region between the source region 314 and the drain region 315 that is not doped with impurities may be a channel region 316.

The semiconductor active layer 313 may include amorphous silicon, an inorganic semiconductor such as polysilicon, or an organic semiconductor.

According to an embodiment, the semiconductor active layer 313 may be an oxide semiconductor. For example, the oxide semiconductor may include an oxide of a material selected from among 4-, 12-, 13-, and 14-group metallic elements, such as zinc (Zn), indium (In), gallium (Ga), tin (Sn), cadmium (Cd), germanium (Ge), and hafnium (Hf), and a combination thereof.

A gate insulating layer 317 may be deposited on the semiconductor active layer 313. The gate insulating layer 317 may be an inorganic layer of $SiO_x$, $SiN_x$, or a metal oxide. The gate insulating layer 317 may be a single-layer film or a multi-layer film.

A gate electrode 318 may be formed on the gate insulating layer 317. The gate electrode 318 may include a single-layer film or a multi-layer film of, for example, gold (Au), silver (Ag), copper (Cu), nickel (Ni), platinum (Pt), Al, molybdenum (Mo), or chromium (Cr). According to an embodiment, the gate electrode 318 may include an alloy, such as Al:neodymium (Nd) or Mo:tungsten (W).

An inter-layer insulating layer 319 may be formed on the gate electrode 318. The inter-layer insulating layer 319 may be formed of an inorganic material, such as, for example, $SiO_x$ or $SiN_x$. According to an embodiment, the inter-layer insulating layer 319 may include an organic material.

A source electrode 320 and a drain electrode 321 may be formed on the inter-layer insulating layer 319. For example, contact holes may be formed in the gate insulating layer 317 and the inter-layer insulating layer 319 by selectively removing parts of the gate insulating layer 317 and the inter-layer insulating layer 319, wherein the source electrode 320 is electrically connected to the source region 314 through one contact hole, and the drain electrode 321 is electrically connected to the drain region 315 through the other contact hole.

A passivation layer 322 may be formed on the source electrode 320 and the drain electrode 321. The passivation layer 322 may be formed of an inorganic material, such as $SiO_x$ or $SiN_x$, or an organic material.

A planarization layer 323 may be formed on the passivation layer 322. The planarization layer 323 may include an organic material, such as, for example, acryl, PI, or benzocyclobutene (BCB).

Any one of the passivation layer 322 and the planarization layer 323 may be omitted.

The organic light-emitting device OLED may be formed on the TFT.

For example, the organic light-emitting device OLED may be formed on the planarization layer 323. The organic light-emitting device OLED may include a first electrode 325, an intermediate layer 326, and a second electrode 327.

The first electrode 325 may function as an anode and may be formed of various conductive materials. The first electrode 325 may include a transparent electrode or a reflective electrode. For example, when the first electrode 325 is used as a transparent electrode, the first electrode 325 may include a transparent conductive layer of, for example, indium tin oxide (ITO), indium zinc oxide (IZO), zinc oxide (ZnO), or indium oxide ($In_2O_3$). When the first electrode 325 is used as a reflective electrode, the first electrode 325 may include a reflective layer formed of Ag, magnesium (Mg), Al, Pt, Pd, Au, Ni, Nd, iridium (Ir), Cr, or a composition thereof and thereafter include a transparent layer of, for example, ITO, IZO, ZnO, or $In_2O_3$ on the reflective layer.

A pixel-defining layer 324 may be formed on the planarization layer 323. The pixel-defining layer 324 may cover a portion of the first electrode 325. The pixel-defining layer 324 may define an emission region of each sub-pixel by surrounding an edge of the first electrode 325. The first electrode 325 may be patterned for each sub-pixel.

The pixel-defining layer 324 may be an organic layer or an inorganic layer. For example, the pixel-defining layer 324 may be formed of an organic material, such as, for example, PI, polyamide, BCB, acryl resin, or phenol resin, or an inorganic material, such as $SiN_x$.

The pixel-defining layer 324 may be a single-layer film or a multi-layer film.

The intermediate layer 326 may be formed on the first electrode 325 in a region exposed by etching a portion of the pixel-defining layer 324. According to the present embodiment, the intermediate layer 326 may be formed by a deposition process.

The intermediate layer 326 may include an organic emission layer. In an embodiment, the intermediate layer 326 may include the organic emission layer and may selectively further include at least one of a hole injection layer (HIL), a hole transport layer (HTL), an electron transport layer (ETL), and an electron injection layer (EIL). In an embodiment, the intermediate layer 326 may include the organic emission layer and may further include various other function layers.

Holes and electrons injected from the first electrode 325 and the second electrode 327 may recombine in the organic emission layer, and light of a desired color may be emitted.

The second electrode 327 may be formed on the intermediate layer 326.

The second electrode 327 may function as a cathode. The second electrode 327 may include a transparent electrode or a reflective electrode. For example, when the second electrode 327 is used as a transparent electrode, the second electrode 327 may be formed by depositing a metal having a low work function, i.e., lithium (Li), calcium (Ca), lithium fluoride (LiF)/Ca, LiF/Al. Al, or Mg, or a composition thereof, on the intermediate layer 326 and further forming a transparent conductive layer of, for example, ITO, IZO, ZnO, or $In_2O_3$ on the metal or the composition thereof.

When the second electrode 327 is used as a reflective electrode, the second electrode 327 may be formed of Li, Ca, LiF/Ca, LiF/Al, Al, Mg, or a composition thereof.

The first electrode 325 may function as an anode, and the second electrode 327 may function as a cathode. In an embodiment, the first electrode 325 may function as a cathode, and the second electrode 327 may function as an anode.

According to an exemplary embodiment, a plurality of sub-pixels may be formed on the flexible substrate 311, and red, green, blue, or white light may be emitted for each sub-pixel.

According to an embodiment, the intermediate layer 326 may be formed to be common to the first electrode 325 regardless of a location of each sub-pixel. The organic emission layer may be formed by vertically stacking layers including emission materials for emitting red, green, and blue lights, respectively, or by mixing the emission materials for respectively emitting red, green, and blue lights.

According to an embodiment, if white light is emitted, other colors may also be emitted. A color conversion layer or a color filter for converting the emitted white light into a predetermined color may be further included.

The thin-film encapsulation layer 340 may be formed to protect the organic light-emitting device OLED from, for example, external moisture and oxygen. According to an embodiment, the thin-film encapsulation layer 340 may be formed by alternately stacking inorganic layers and organic layers on the organic light-emitting device OLED.

For example, the thin-film encapsulation layer 340 may have a structure in which at least one inorganic layer 341 and at least one organic layer 342 are stacked. The at least one inorganic layer 341 may include a first inorganic layer 343, a second inorganic layer 344, and a third inorganic layer 345. The at least one organic layer 342 may include a first organic layer 346 and a second organic layer 347.

The at least one inorganic layer 341 may be formed of $SiO_2$, $SiN_x$, $Al_2O_3$, titanium oxide ($TiO_2$), zirconium oxide ($ZrO_x$), or ZnO. The at least one organic layer 342 may be formed of epoxy, PI, PET, PC, polyethylene, or PAR.

For convenience of a manufacturing process, a plurality of flexible display devices 300 may be simultaneously manufactured using a mother substrate. For example, a cutting line may be formed between pairs of neighboring flexible display devices 300, and unit flexible display devices 300 may be separated by using a cutting device for cutting the pairs of neighboring flexible display devices 300 along the cutting line.

In the present embodiment, a laser cutting device may be used as the cutting device.

Figure 4:
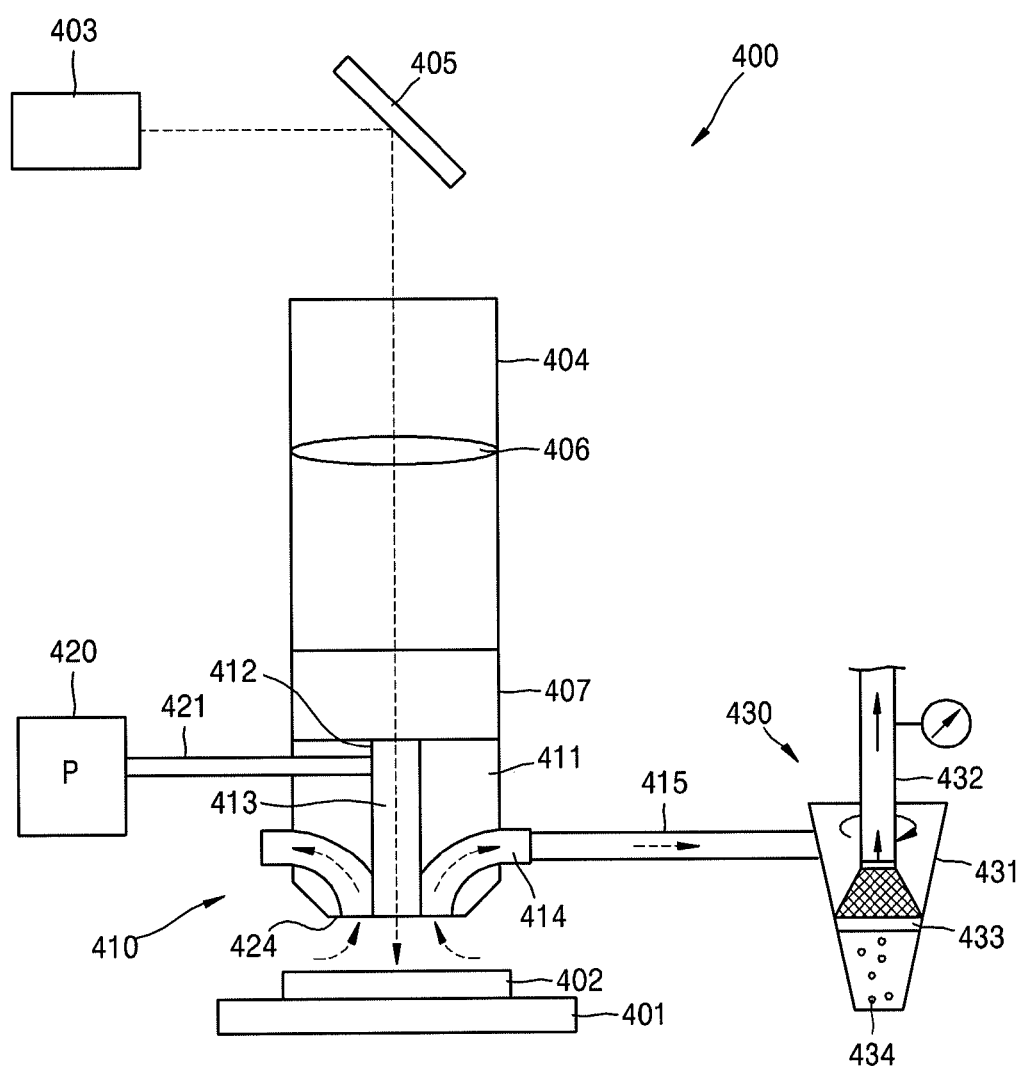
FIG. 4 illustrates a configuration diagram of a laser cutting device according to an embodiment.
Figure 5:
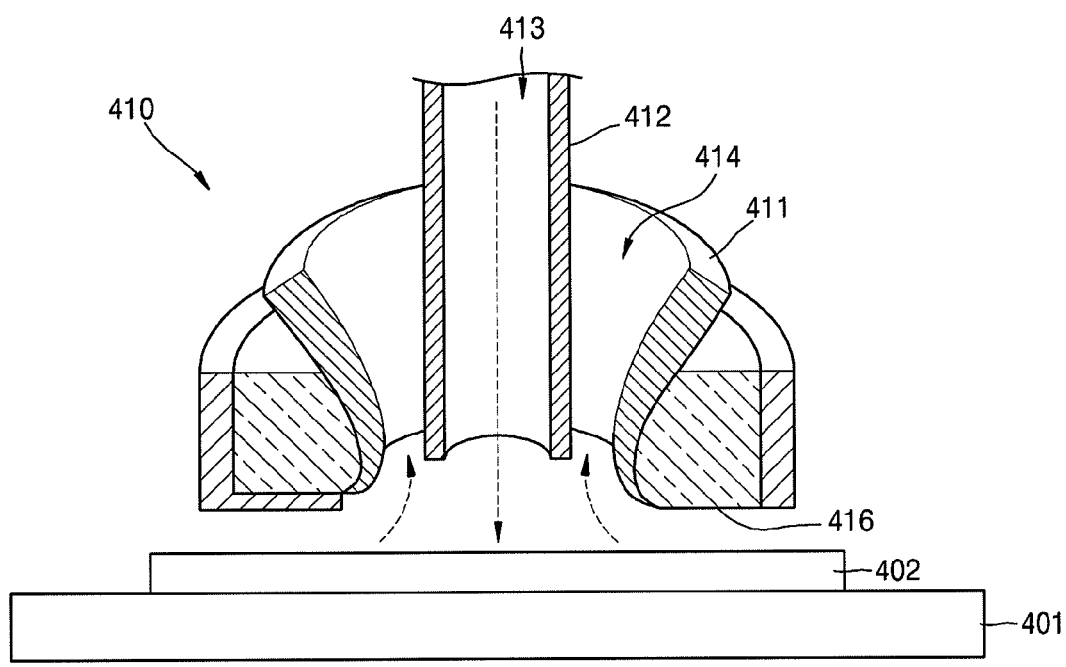
FIG. 5 illustrates a cross-sectional view of a portion of a suction unit in the laser cutting device of FIG. 4.
Figure 6:
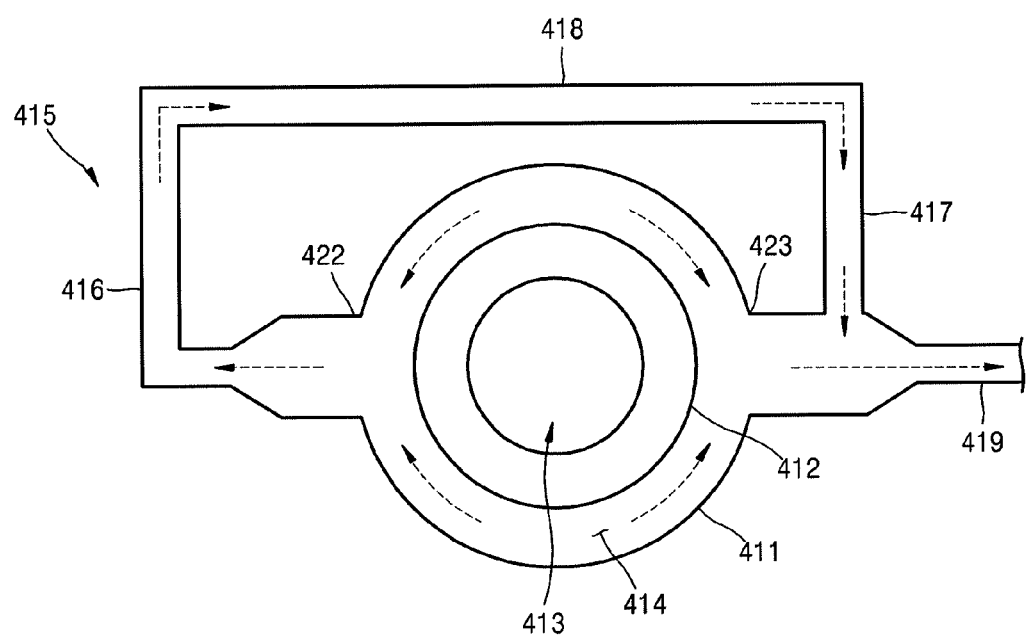
FIG. 6 illustrates a top view of the suction unit of FIG. 5 to discharge impurities.

FIG. 4 illustrates a configuration diagram of a laser cutting device 400 according to an embodiment, FIG. 5 illustrates a cross-sectional view of a portion of a suction unit 410 in the laser cutting device 400 of FIG. 4, and FIG. 6 illustrates a top view of the suction unit 410 of FIG. 5, which shows discharge of impurities. Referring to FIGS. 4 to 6, the laser cutting device 400 may include a laser beam generation unit 403 for emitting a laser beam, an optical system 406 mounted on a path of the laser beam, a laser main body 404 for providing a passage through which the laser beam, which has passed through the optical system, travels towards a substrate 402, the suction unit 410 coupled to the laser main body 404, and a collection unit 430 connected to the suction unit 410.

The substrate 402 may be mounted on a substrate stage 401. The substrate 402 may be a flexible film on which displays for displaying an image are arranged to be apart from one another. The substrate stage 401 may be a substrate support for mounting the substrate 402 thereon. The substrate stage 401 may move in an X or Y direction or may rotate.

The laser beam generation unit 403 may be a device for generating a laser beam. The laser beam generation unit 403 may include a solid laser, such as a ruby laser, a glass laser, a yttrium aluminum garnet (YAG) laser, or a yttrium-lithium-fluoride (YLF) laser, and a gas laser, such as an excimer laser or a helium-neon laser.

The optical system 406 may be located on a traveling path of the laser beam generated by the laser beam generation unit 403. The optical system 406 may include a homogenizer for making a shape of the laser beam uniform or a condensing lens for focusing the laser beam. The laser beam, which has passed through the optical system 406, may be formed in a desired shape, such as, for example, a linear beam or a rectangular beam. In the present embodiment, the optical system 406 is mounted inside the laser main body 404.

According to an embodiment, a mirror 405 for changing an angle of the laser beam irradiated by the laser beam generation unit 403 may be further included on the path of the laser beam. The mirror 405 may include a galvano mirror or a reflective mirror capable of linearly changing an angle according to a change in an input voltage.

In an embodiment, the laser beam generation unit 403 and the optical system 406 may be arranged in a vertical direction of the substrate 402, the laser beam generated by the laser beam generation unit 403 may be irradiated on the substrate 402 in a vertical direction, and the mirror 405 may not be needed.

The laser main body 404 may have a through hole in a length direction thereof to provide a passage through which the laser beam irradiated from the laser beam generation unit 403 travels towards the substrate 402.

The suction unit 410 may be coupled to the laser main body 404. The suction unit 410 may provide a passage, e.g., a passageway, for the laser beam and may discharge impurities.

For example, the suction unit 410 may include a suction main body 411, a nozzle 412 mounted inside the suction main body 411, an exhaust part 414 formed in the suction main body 411, and a connection pipe 415 connected to the exhaust part 414.

The suction main body 411 may be coupled to a header 407 of the laser main body 404. The suction main body 411 may have a cylindrical outer appearance. The suction main body 411 may have a hollow region therein, and the nozzle 412 may be located in the hollow region. The nozzle 412 may be located to be spaced apart from an inner-circumferential wall of the suction main body 411.

The nozzle 412 may have a through hole 413 connected to the laser main body 404. The laser beam may travel towards the substrate 402 through the through hole 413. The through hole 413 may be formed in a length direction of the nozzle 412, and the laser beam may be irradiated, e.g., in a vertical direction. The through hole 413 may have a larger circular horizontal cross-sectional area, e.g., a larger circular cross-sectional area in a direction orthogonal to a direction in which the laser beam is irradiated, than the laser beam, and an inner-circumferential wall of the nozzle 412 may surround the laser beam.

The nozzle 412 may pass gas, e.g., air, therethrough.

For example, a gas supply pipe 421 may be connected to one side of the nozzle 412. A pump 420 for generating gas, such as air, may be connected to the gas supply pipe 421. Gas generated by driving the pump 420 may be supplied to the nozzle 412 via the gas supply pipe 421. According to an embodiment, a device for supplying gas, which may be coupled to an upper end side of the nozzle 412, may vary.

The exhaust part 414 may be formed in the suction main body 411. The exhaust part 414 may include a space formed between the inner-circumferential wall of the suction main body 411 and an outer-circumferential surface of the nozzle 412. The exhaust part 414 may be formed in a ring shape in the suction main body 411 around the nozzle 412, e.g., surrounding the nozzle 412. The exhaust part 414 may be connected to an end portion 424 of the nozzle 412 and provides a passage through which impurities generated when the substrate 402 is cut move.

The inner-circumferential wall of the suction main body 411 may have a curved surface in the vertical direction of the suction main body 411, e.g., in the direction in which the laser beam is irradiated. When gas is supplied onto the substrate 402 via the through hole 413 of the nozzle 412, the gas and impurities may move along the inner-circumferential wall of the suction main body 411 having a curved surface, for example, due to a Coanda effect.

The space of the exhaust part 414 may be connected to the connection pipe 415 via a penetrated portion in at least one side of the suction main body 411. For example, a path that penetrates in a thickness direction of the suction main body 411, e.g., a thickness of the suction main body 411 in a direction orthogonal to a direction in which the laser beam is irradiated, may be formed at a first side 422 of the suction main body 411 and may be connected to the space of the exhaust part 414. A second side 423, which is opposite to the first side 422 of the suction main body 411, may also be connected to the space of the exhaust part 414.

According to an embodiment, the path that penetrates in the thickness direction of the suction main body 411, e.g., a thickness of the suction main body 411 in a direction orthogonal to a direction in which the laser beam is irradiated, which may have a structure connected to the space of the exhaust part 414, e.g., connecting the space of the exhaust part 414 to the connection pipe 415, may vary in number and shape.

The space of the exhaust part 414 may be connected to the connection pipe 415 via the penetration path of the suction main body 411. The connection pipe 415 may be connected to the collection unit 430 to provide a passage for the impurities.

For example, a first connection pipe 416 may be connected to the first side 422 of the suction main body 411. A second connection pipe 417 may be connected to the second side 423 of the suction main body 411. The first connection pipe 416 and the second connection pipe 417 may be connected to each other via a third connection pipe 418. The second connection pipe 417 may be connected to a fourth connection pipe 419 connected to the collection unit 430.

According to an embodiment, the first connection pipe 416, the second connection pipe 417, the third connection pipe 418, and the fourth connection pipe 419 may be formed in one body.

The collection unit 430 may be connected to the suction unit 410. The collection unit 430 may collect impurities discharged through the suction unit 410.

The collection unit 430 may include a collection case 431, an exhaust pipe 432 mounted inside the collection case 431, and a filter 433 connected to the exhaust pipe 432.

For example, the collection case 431 may be connected to the fourth connection pipe 419. Impurities sucked from the suction unit 410 may be discharged into the collection case 431 via the fourth connection pipe 419.

The exhaust pipe 432 may be mounted inside the collection case 431 in a vertical direction, e.g., in the direction in which the laser beam is irradiated. The exhaust pipe 432 may rotate in one direction. By a rotary motion, impurities may be sucked from the suction unit 410. During the rotary motion, the sucked impurities may also rotate. Smoke collected with the impurities may in the collection case be discharged to the outside of the collection case 431 via the exhaust pipe 432.

The filter 433 may be mounted below the exhaust pipe 432. Impurity particles 434 may be filtered by the filter 433 and may be collected in a lower portion of the collection case 431.

An operation of the laser cutting device 400 having the configuration described above will now be described.

The substrate 402 to be cut is mounted on the substrate stage 401. The substrate 402 may be large enough to simultaneously form a plurality of display devices. The substrate 402 may be a flexible film.

The laser main body 404 is located above the substrate 402.

The laser beam generation unit 403 emits a laser beam. The laser beam may change a path thereof by the mirror 405 and travel towards the substrate 402. The laser beam may have a desired shape and be focused towards the substrate 402 by passing through the optical system 406.

The laser beam passes through the through hole 413 of the nozzle 412 via the header 407 of the laser main body 404. The laser beam, which has passed through the nozzle 412, is irradiated on the substrate 402 and may melt a cutting line formed in the substrate 402.

During the laser cutting, the gas, e.g., air, generated by the pump 420 may be supplied to the nozzle 412 in the vertical direction of the nozzle 412 via the gas supply pipe 421.

Impurities generated, for example, due to the melting of the substrate 402, may be discharged through the space of the exhaust part 414, which may be formed between the inner-circumferential wall of the suction main body 411 and the outer-circumferential surface of the nozzle 412.

For example, when the gas is supplied at a high speed, negative pressure may be formed between the substrate 402 and the suction main body 411, and the impurities may be sucked through the space of the exhaust part 414. The impurities may move along the inner-circumferential wall of the suction main body 411 having a curved surface, for example, due to a Coanda effect. Due to the Coanda effect, the laser beam and the impurities may mutually avoid the line of flow.

The impurities discharged through the space of the exhaust part 414 may be discharged through the first and second connection pipes 416 and 417 respectively connected to the first and second sides 422 and 423 of the suction main body 411 and may be discharged to the collection unit 430 via the fourth connection pipe 419 connected to the first and second connection pipes 416 and 417.

The impurities sucked into the collection case 431 may rotate along the rotation of the exhaust pipe 432, e.g., may rotate along with the rotation of the exhaust pipe 432. During the rotary motion, the impurity particles 434 may be filtered by the filter 433, for example, due to a centripetal force, and collected in the lower portion of the collection case 431, and the smoke may be discharged to the outside of the collection case 431 via the exhaust pipe 432.

By way of summation and review, a display device, for example, a slim display device, may be used for mobile devices, such as smartphones, tablet personal computers (PCs), laptop computers, digital cameras, camcorders, and portable information terminals, and electronic devices, such as slim TVs, exhibition displays, and advertisement boards.

Flexible display devices, for example, a flexible display device based on an organic light-emitting display technique, which may be easy to carry and capable of being applied to variously shaped devices, may be a next-generation display device. A display device may undergo a cutting process, and during the cutting process, impurities generated on a substrate may need to be removed.

As described above, according to the one or more exemplary embodiments, a laser cutting device may easily remove impurities generated when a substrate is cut.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A laser cutting device, comprising:
a laser beam generation unit emitting a laser beam;
an optical system on a traveling path of the laser beam;
a laser main body providing a passage through which the laser beam travels towards a substrate after passing through the optical system;
a suction unit coupled to a header of the laser main body, the suction unit sucking impurities;
a connection pipe; and
a collection unit connected to the suction unit, the collection unit collecting discharged impurities, wherein:
the suction unit includes:
  a nozzle, a gas and the laser beam passing through the nozzle, the gas having a flow directed along the laser beam towards the substrate,
  a suction main body, and
  an exhaust part through which impurities are sucked, the exhaust part being in the suction main body,
the connection pipe is connected to the exhaust part and the collection unit,
the nozzle is inside the suction main body, the nozzle having a nozzle outlet from which the gas flows,
the exhaust part includes a space that is between an inner-circumferential wall of the suction main body and an outer-circumferential surface of the nozzle, and is in communication with the nozzle outlet,
the inner-circumferential wall has a cross-section, in a direction normal to the substrate and intersecting an irradiation location of the laser beam on the substrate, that is curved, the impurities being discharged to the collection unit along the inner-circumferential wall, and
the nozzle outlet is spaced apart, along the entire circumference thereof, from the inner-circumferential wall.
2. The laser cutting device as claimed in claim 1, wherein the nozzle has a through hole through which the laser beam traveling towards the substrate is irradiated and through which the gas is emitted towards the substrate.

3. The laser cutting device as claimed in claim 2, wherein the nozzle has a circular cross-sectional shape in a direction orthogonal to a direction in which the laser beam is irradiated.

4. The laser cutting device as claimed in claim 1, wherein the exhaust part is a ring shape surrounding the nozzle.

5. The laser cutting device as claimed in claim 1, wherein the space of the exhaust part between the inner-circumferential wall of the suction main body and the outer-circumferential surface of the nozzle is connected to the connection pipe via a penetrated portion in at least one side of the suction main body.

6. The laser cutting device as claimed in claim 5, wherein the connection pipe connects the collection unit and the space of the exhaust part between the inner-circumferential wall of the suction main body and the outer-circumferential surface of the nozzle.

7. The laser cutting device as claimed in claim 6, wherein the space of the exhaust part between the inner-circumferential wall of the suction main body and the outer-circumferential surface of the nozzle is connected to one end of the connection pipe by a path penetrating a thickness of the suction main body in a direction orthogonal to a direction in which the laser beam is irradiated, and the other end of the connection pipe is connected to the collection unit.

8. The laser cutting device as claimed in claim 1, wherein the nozzle is connected via a gas supply pipe to a pump generating gas.

9. The laser cutting device as claimed in claim 8, wherein the gas supply pipe is coupled to an upper end of the nozzle.

10. The laser cutting device as claimed in claim 1, wherein the collection unit includes:
a collection case connected to the suction unit;
an exhaust pipe inside the collection case; and
a filter connected to the exhaust pipe.

11. The laser cutting device as claimed in claim 10, wherein the exhaust pipe rotates in one direction and sucks the impurities from the suction unit.

12. The laser cutting device as claimed in claim 10, wherein gas collected with the impurities in the collection case is discharged outside of the collection case through the exhaust pipe.

13. The laser cutting device as claimed in claim 10, wherein the filter is mounted below the exhaust pipe and collects impurity particles in a lower portion of the collection case.

14. The laser cutting device as claimed in claim 1, wherein the substrate is large enough to form a plurality of display devices.

15. The laser cutting device as claimed in claim 14, wherein:
the substrate is a flexible substrate, and
the flexible substrate includes a thin-film transistor and an organic light-emitting diode connected to the thin-film transistor.

* * * * *